(12) United States Patent  (10) Patent No.: US 8,412,132 B2
Tang et al.  (45) Date of Patent: Apr. 2, 2013

(54) TECHNIQUES FOR ADAPTIVE PREDISTORTION DIRECT CURRENT OFFSET CORRECTION IN A TRANSMITTER

(75) Inventors: Clive K. Tang, Chandler, AZ (US); Bing Xu, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 995 days.

(21) Appl. No.: 12/195,910

(22) Filed: Aug. 21, 2008

(65) Prior Publication Data

US 2010/0048149 A1 Feb. 25, 2010

(51) Int. Cl.
*H04B 1/04* (2006.01)
(52) U.S. Cl. .................. 455/114.2; 455/114.3; 375/296
(58) Field of Classification Search .... 455/114.2–114.3; 375/296–297
See application file for complete search history.

(56) References Cited

U.S. PATENT DOCUMENTS

| 6,141,390 | A | * | 10/2000 | Cova | 375/297 |
| 6,396,345 | B2 | * | 5/2002 | Dolman | 330/149 |
| 7,058,369 | B1 | | 6/2006 | Wright et al. | |
| 7,146,138 | B2 | * | 12/2006 | Anvari | 455/114.3 |
| 7,260,365 | B1 | | 8/2007 | Wright et al. | |
| 7,295,815 | B1 | | 11/2007 | Wright et al. | |
| 7,529,313 | B2 | * | 5/2009 | Naito et al. | 375/271 |
| 7,583,754 | B2 | * | 9/2009 | Liu | 375/297 |
| 7,672,397 | B2 | * | 3/2010 | Irscheid et al. | 375/297 |
| 7,848,449 | B2 | * | 12/2010 | Nagatani et al. | 375/296 |
| 7,904,033 | B1 | * | 3/2011 | Wright et al. | 455/114.2 |
| 2002/0186783 | A1 | * | 12/2002 | Opas et al. | 375/297 |
| 2003/0058959 | A1 | * | 3/2003 | Rafie et al. | 375/296 |
| 2004/0121741 | A1 | * | 6/2004 | Rashev et al. | 455/114.3 |
| 2005/0025255 | A1 | | 2/2005 | Francos et al. | |
| 2005/0129141 | A1 | * | 6/2005 | Lee | 375/298 |
| 2005/0226346 | A1 | * | 10/2005 | Ode et al. | 375/296 |
| 2006/0062324 | A1 | | 3/2006 | Naito et al. | |
| 2009/0111399 | A1 | * | 4/2009 | Norris et al. | 455/114.3 |

* cited by examiner

*Primary Examiner* — Simon Nguyen
(74) *Attorney, Agent, or Firm* — Yudell Isidore Ng Russell PLLC

(57) ABSTRACT

A technique for performing adaptive predistortion in a transmitter includes receiving, at a first input of an error signal unit, a delayed version of a baseband input signal. The technique also includes receiving, at a second input of the error signal unit, a power amplifier feedback signal from an output of a power amplifier. An input error signal that corresponds to a difference between the delayed version of the baseband input signal and the power amplifier feedback signal is then provided at an output of the error signal unit. The input error signal is then received at an input of a signal conditioner. An adjusted error signal that has a lower direct current offset than the input error signal is provided at an output of the signal conditioner.

17 Claims, 3 Drawing Sheets

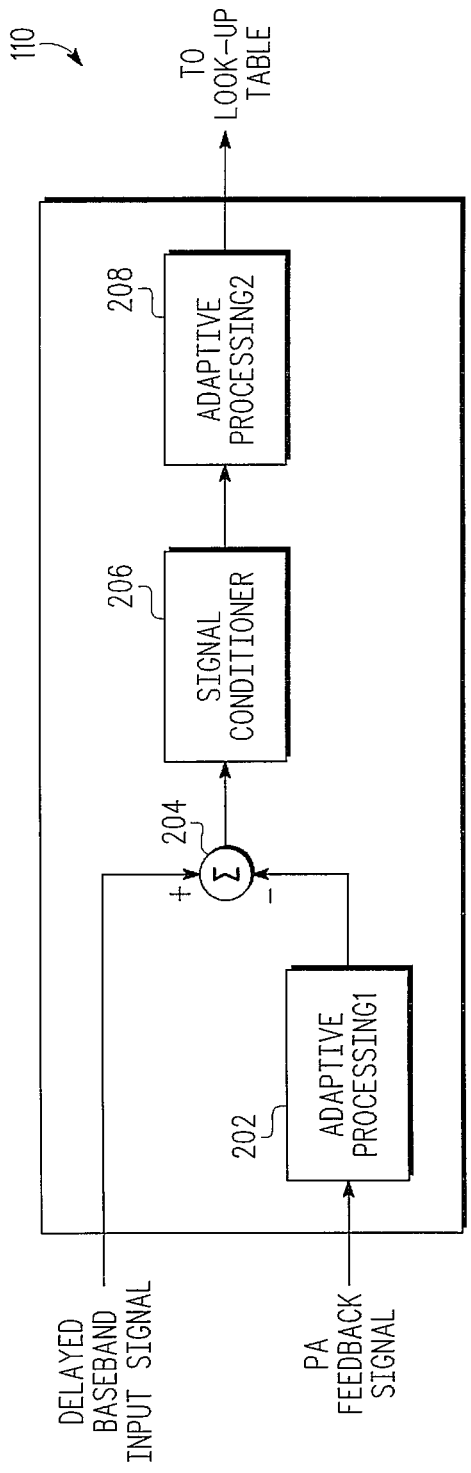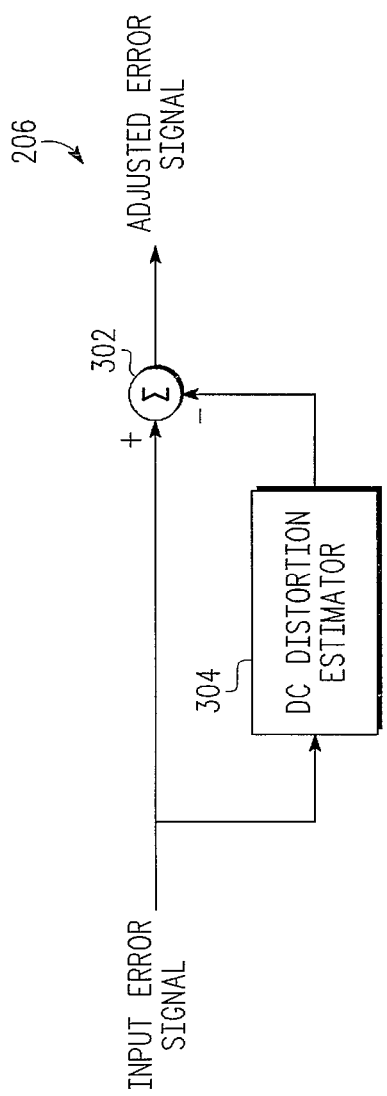

TECHNIQUES FOR ADAPTIVE PREDISTORTION DIRECT CURRENT OFFSET CORRECTION IN A TRANSMITTER

BACKGROUND

1. Field

This disclosure relates generally to adaptive predistortion and, more specifically, to techniques for adaptive predistortion direct current offset correction in a transmitter.

2. Related Art

In general, due to technology limitations, power amplifiers (PAs) are inherently non-linear devices that may distort a signal to be transmitted causing adjacent channel leakage and out-of-band emissions. Moreover, distortion attributable to PA non-linearity may hinder symbol recovery of a transmitted signal at a receiver. Adaptive predistortion (APD) is a known approach that has been utilized to address transmitter PA non-linearity. According to the APD approach, a function that represents an inverse of a PA transfer function is multiplied with a baseband input signal in order to linearize an overall PA gain at an output of the PA. Typically, predistortion is implemented in an adaptive closed-loop configuration in which a PA output signal is fed back to an APD unit that compares the PA output signal (or a portion thereof) with a baseband input signal to facilitate minimization of distortion in transmitted signals. The feedback arrangement allows the predistortion function to be adapted to changes in PA characteristics due to temperature, etc.

In a typical APD configuration, an adaptive algorithm is employed to compare a delayed baseband input signal with a fed back PA output signal to provide an error signal that drives a look-up table. Based on the error signal, an entry (e.g., a transfer function) from the look-up table is selected to provide a predistortion function that is multiplied with the baseband input signal. Ideally, the error signal is zero when the closed-loop configuration settles. Unfortunately, even a small direct current (DC) offset (after coarse DC offset correction) may cause a transmitter to exhibit excessive spurious emissions. For example, a few millivolts DC offset in an APD feedback path of a transmitter may result in excessive out-of-band leakage (e.g., modulation output radio frequency spectrum (mod ORFS) figures) that may cause the transmitter to fail specifications.

Traditionally, one of three approaches have usually been employed in digital (and mixed) transceiver integrated circuits (ICs) for direct current (DC) offset correction. A first DC offset correction approach has implemented an accumulator and dump technique that has averaged samples in the absence of a modulated signal. Unfortunately, a DC offset may vary when a signal is modulated. A second DC offset correction approach has implemented an in-line low-pass filter technique that usually works well in very low intermediate frequency (VLIF) transceiver architectures. Unfortunately, the in-line low-pass filter technique inserts extra delay in a transmit path. A third DC offset correction approach has implemented a feedback loop that employs one or more comparators. While relatively accurate, implementing comparators in a feedback loop increases an analog area of an associated IC.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 2 provides a more detailed diagram of an example adaptive algorithm block that may be employed in the transmitter of FIG. 1, according to an embodiment of the present invention.

FIG. 3 provides a more detailed diagram of an example signal conditioner that may be employed in the adaptive algorithm block of FIG. 2, according to an embodiment of the present invention.

DETAILED DESCRIPTION

Figure 1:
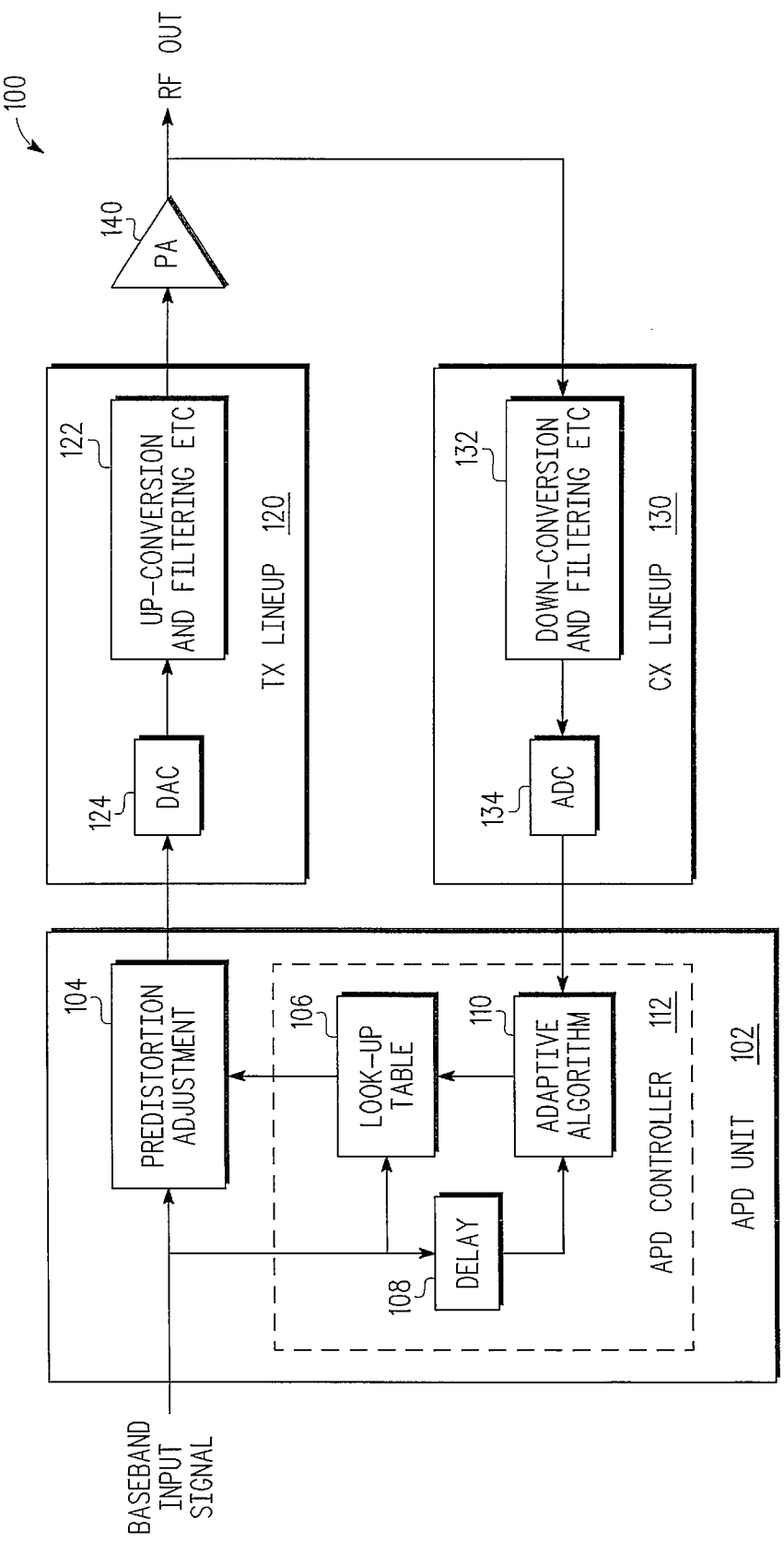
FIG. 1 is an example diagram of a relevant portion of a transmitter configured according to an embodiment of the present invention.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical, and other changes may be made without departing from the spirit or scope of the present invention. The following detailed description is, therefore, not to be taken in a limiting sense and the scope of the present invention is defined only by the appended claims and their equivalents. In particular, the embodiments described below may be embodied in various wired or wireless communication devices.

The disclosed techniques are contemplated to be applicable to systems that employ a variety of signaling techniques (e.g., orthogonal frequency division multiplex (OFDM), single-carrier frequency division multiple access (SC-FDMA), or code division multiple access (CDMA) signaling) on uplink and/or downlink channels. A transmitter of a subscriber station (SS) or a serving base station (BS) may implement one of a phase shift keying (PSK), a quadrature amplitude modulation (QAM), or other data modulation scheme, depending upon which modulation scheme is scheduled. It should be appreciated that any of the various PSK, e.g., BPSK, QPSK and 8-PSK, or QAM, e.g., 16-QAM and 64-QAM, modulation techniques may be implemented in a communication system constructed according to the present disclosure.

According to various aspects of the present disclosure, a signal conditioner is incorporated within an adaptive predistortion (APD) unit to reduce distortion effects attributable to direct current (DC) offsets in a power amplifier (PA) feedback path. In at least one embodiment, the signal conditioner is inserted at an output of a summer block that computes a difference between a baseband input signal and fed back PA output signal (i.e., computes an error signal that corresponds to a difference between transmit and feedback path signals). In various embodiments, the signal conditioner includes a DC distortion estimator that estimates distortion caused by a DC component. The signal conditioner reduces distortion in a transmitted signal by subtracting the estimated distortion from an input error signal to provide a "cleaned-up" error signal. The 'cleaned-up' error signal is then processed (by the APD unit) to provide an adjusted signal that drives a look-up table. The estimator may be, for example, a relatively simple moving average block filter, a finite impulse response (FIR)

filter, an infinite impulse response (IIR) filter, any other application appropriate filter, or other application appropriate circuitry.

Advantageously, a signal conditioner configured according to one embodiment of the present disclosure removes residual DC, tracks DC variation, and introduces no delay in a transmit path of a transmitter. In various embodiments, the signal conditioner is independent of the feedback path, as well as other parts of the APD. Advantageously, the signal conditioner is configured to cope with any fine DC-related offset that is present in the feedback path. The signal conditioner 'cleans' and 'fine-tunes' the input error signal before it is further processed enabling a more accurate predistortion function to be selected, resulting in improved modulation output radio frequency spectrum (mod ORFS), improved adjacent channel leakage ratio (ACLR), and reduced out-of-band emissions.

According to one embodiment of the present disclosure, an adaptive predistortion unit for a transmitter includes an error signal unit (e.g., a summer) and a signal conditioner. The error signal unit includes a first input configured to receive a delayed version of a baseband input signal, a second input configured to receive a power amplifier feedback signal from an output of a power amplifier, and an output configured to provide an input error signal that corresponds to a difference between the delayed version of the baseband input signal and the power amplifier feedback signal. The signal conditioner includes an input configured to receive the input error signal and an output configured to provide an adjusted error signal that has a lower direct current offset than the input error signal.

According to another embodiment of the present disclosure, a technique for performing adaptive predistortion in a transmitter includes receiving, at a first input of an error signal unit (e.g., a summer), a delayed version of a baseband input signal. The technique also includes receiving, at a second input of the error signal unit, a power amplifier feedback signal from an output of a power amplifier. An input error signal that corresponds to a difference between the delayed version of the baseband input signal and the power amplifier feedback signal is then provided at an output of the error signal unit. The input error signal is then received at an input of a signal conditioner. An adjusted error signal (that has a lower direct current offset than the input error signal) is provided at an output of the signal conditioner.

According to yet another embodiment of the present disclosure, a transmitter includes a power amplifier and an adaptive predistortion unit. The adaptive predistortion unit includes an error signal unit and a signal conditioner. The error signal unit (e.g., a summer) includes a first input (configured to receive a delayed version of a baseband input signal), a second input (configured to receive a power amplifier feedback signal from an output of a power amplifier), and an output (configured to provide an input error signal that corresponds to a difference between the delayed version of the baseband input signal and the power amplifier feedback signal). The signal conditioner includes an input configured to receive the input error signal and an output configured to provide an adjusted error signal that has a lower direct current offset than the input error signal. Accordingly, lowering the direct current offset associated with the input error signal reduces a transmitted signal distortion associated with the power amplifier.

With reference to FIG. 1, a relevant portion of a transceiver 100 is depicted that is configured to perform adaptive predistortion (APD) on a signal that is to be transmitted. As depicted, the transceiver 100 includes an APD unit 102 that receives a baseband input signal (from a baseband signal source (not shown)) and a fed back power amplifier (PA) output signal (provided from an output of PA 140, via compare (CX) lineup 130). The CX lineup 130 includes a down-conversion and filtering block 132 and an analog-to-digital converter (ADC) 134. In one or more embodiments, a receiver (RX) lineup of the transceiver 100 may be configured to provide the CX lineup 130. Alternatively, the CX lineup 130 may be provided in addition to an RX lineup. An adaptive algorithm block 110 of APD controller 112 is configured to utilize a delayed version of the baseband input signal and the fed back PA output signal (PA feedback signal) to select an entry point into look-up table 106.

The APD controller 112 may include a processor (e.g., a digital signal processor (DSP)) that includes or is coupled to an application appropriate amount of volatile and non-volatile memory. Alternatively, the APD controller 112 may take the form of a programmable logic device (PLD), an application specific integrated circuit (ASIC), or other circuitry. In one or more embodiments, a function stored at the entry point of the look-up table 106 (e.g., allocated in the non-volatile memory) is utilized as a predistortion adjustment function for multiplication with the baseband input signal. A predistortion adjustment block 104, e.g., a multiplier, multiplies the baseband input signal with the predistortion adjustment factor to provide an APD compensated signal to an input of the TX lineup 120. The TX lineup 120 includes a digital-to-analog converter (DAC) 124 and an up-conversion and filtering block 122, whose output is coupled to an input of the PA 140.

Turning to FIG. 2, the adaptive algorithm block 110 is shown as including a first adaptive processing block (labeled "adaptive processing1") 202, a summer (error signal unit) 204, a signal conditioner 206, and a second adaptive processing block (labeled "adaptive processing2") 208. The first adaptive processing block 202 receives the PA feedback signal and processes (e.g., low-pass filters) the PA feedback signal. The summer 204 subtracts the processed PA feedback signal from a delayed baseband input signal to provide an error signal. It should be appreciated that a delay of the delayed baseband input signal substantially corresponds to a delay of the transmit path (i.e., the delay introduced by the TX lineup 120 and the PA 140) and the feedback path (i.e., the delay introduced by the CX lineup 130). The input error signal is processed by the signal conditioner 206 to provide an adjusted error signal that is processed (e.g., low-pass filtered) by the second adaptive processing block 208. The processed adjusted error signal is then utilized to provide an entry point into the look-up table 106.

With reference to FIG. 3, the signal conditioner 206 may be configured to include a DC distortion estimator 304 and a summer 302. The DC distortion estimator 304 provides an estimated DC distortion signal (based on the input error signal) that is subtracted from the input error signal by the summer 302 to provide an adjusted error signal. The estimator 304 may be implemented as a relatively simple moving average block filter, a finite impulse response (FIR) filter, an infinite impulse response (IIR) filter, any other application appropriate filter, or other application appropriate circuitry.

Figure 4:
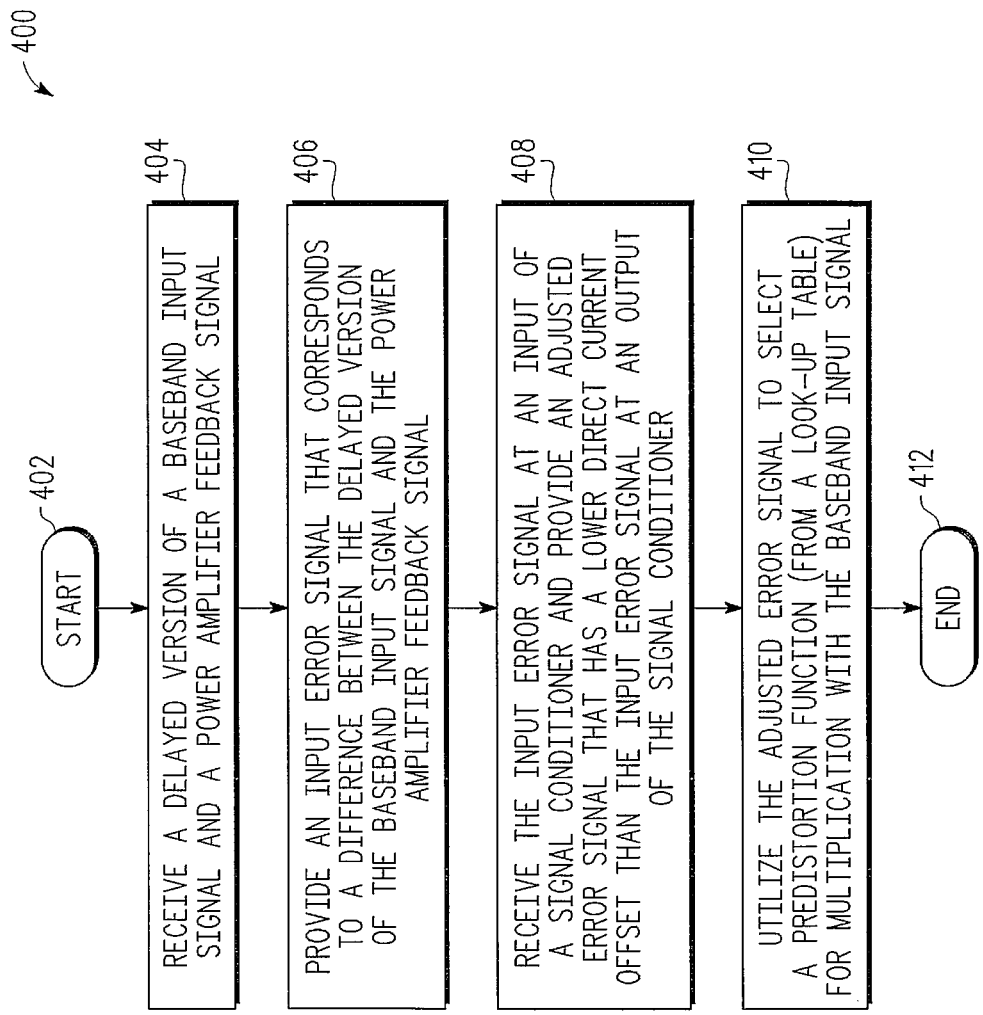
FIG. 4 is a flowchart of an example routine for performing adaptive predistortion direct current offset correction in a transmitter, according to an embodiment of the present invention.

Moving to FIG. 4, an example process 400 for performing adaptive predistortion direct current offset correction in a transmitter, according to an embodiment of the present invention, is illustrated. The process 400 is initiated in block 402, at which point control transfers to block 404. In block 404, a first input of an error signal unit receives a delayed version of a baseband input signal and a second input of the error signal unit receives a power amplifier (PA) feedback signal from an output of a power amplifier. Next, in block 406, an output of the error signal unit provides an input error signal that corresponds to a difference between the delayed version of the baseband input signal and the PA feedback signal. Then, in block 408, a signal conditioner receives (at an input) the input error signal and provides (at an output) an adjusted error signal that has a lower direct current (DC) offset than the input error signal. Next, in block 410, the adjusted error signal is utilized to select, from a look-up table that includes multiple predistortion functions, one of the multiple predistortion functions to provide a function for multiplication with the baseband input signal. In this manner, the signal conditioner substantially removes DC offset, thus, facilitating reduction in transmitted signal distortion. Finally, control transfers from block 410 to block 412 where control returns to a calling routine. Accordingly, techniques have been disclosed herein that remove DC offset from an APD feedback path and advantageously lower transmitted signal distortion.

As may be used herein, a software system can include one or more objects, agents, threads, subroutines, separate software applications, two or more lines of code or other suitable software structures operating in one or more separate software applications, on one or more different processors, or other suitable software architectures.

As will be appreciated, the processes in preferred embodiments of the present invention may be implemented using any combination of software, firmware, or hardware. As a preparatory step to practicing the invention in software, code (whether software or firmware) according to a preferred embodiment will typically be stored in one or more machine readable storage mediums such as fixed (hard) drives, diskettes, optical disks, magnetic tape, semiconductor memories such as read-only memories (ROMs), programmable ROMs (PROMs), etc., thereby making an article of manufacture in accordance with the invention. The article of manufacture containing the code is used by either executing the code directly from the storage device, or by copying the code from the storage device into another storage device such as a hard disk, random access memory (RAM), etc. The method form of the invention may be practiced by combining one or more machine-readable storage devices containing the code according to the present invention with appropriate standard processor hardware to execute the code contained therein. An apparatus for practicing the invention could be one or more processors and storage systems containing or having network access to one or more programs coded in accordance with the invention.

Although the invention is described herein with reference to specific embodiments, various modifications and changes can be made without departing from the scope of the present invention as set forth in the claims below. For example, many of the techniques disclosed herein are broadly applicable to a variety of transmitters (or transmitters of transceivers) employed in wired or wireless communication systems. Accordingly, the specification and figures are to be regarded in an illustrative rather than a restrictive sense, and all such modifications are intended to be included with the scope of the present invention. Any benefits, advantages, or solution to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An adaptive predistortion unit for a transmitter, comprising:
   an error signal unit having a first input configured to receive a delayed version of a baseband input signal, a second input configured to receive a power amplifier feedback signal from an output of a power amplifier, and an output configured to provide an input error signal that corresponds to a difference between the delayed version of the baseband input signal and the power amplifier feedback signal;
   a signal conditioner having an input configured to receive the input error signal and an output configured to provide an adjusted error signal that has a lower direct current offset than the input error signal; and
   a look-up table including multiple predistortion functions, wherein one of the multiple predistortion functions is selected based on the adjusted error signal to provide a function for multiplication with the baseband input signal.

2. The adaptive predistortion unit of claim 1, further comprising:
   a delay unit including an input configured to receive the baseband input signal and an output configured to provide the delayed version of the baseband input signal.

3. The adaptive predistortion unit of claim 1, further comprising:
   a predistortion adjustment unit configured to multiply the selected one of the multiple predistortion functions with the baseband input signal.

4. The adaptive predistortion unit of claim 1, wherein the signal conditioner further comprises:
   a direct current distortion estimator including an input configured to receive the input error signal and an output configured to provide an estimated distortion signal; and
   a summer including a first input configured to receive the input error signal, a second input configured to receive the estimated distortion signal, and an output configured to provide the adjusted error signal, wherein the adjusted error signal corresponds to a difference between the input error signal and the estimated distortion signal.

5. The adaptive predistortion unit of claim 4, wherein the direct current distortion estimator comprises a moving average block filter.

6. The adaptive predistortion unit of claim 4, wherein the direct current distortion estimator comprises a finite impulse response filter.

7. The adaptive predistortion unit of claim 4, wherein the direct current distortion estimator comprises an infinite impulse response filter.

8. A method for performing adaptive predistortion in a transmitter, comprising:
   receiving, at a first input of an error signal unit, a delayed version of a baseband input signal;
   receiving, at a second input of the error signal unit, a power amplifier feedback signal from an output of a power amplifier;
   providing, at an output of the error signal unit, an input error signal that corresponds to a difference between the delayed version of the baseband input signal and the power amplifier feedback signal;
   receiving, at an input of a signal conditioner, the input error signal;
   providing, at an output of the signal conditioner, an adjusted error signal that has a lower direct current offset than the input error signal; and selecting, from a look-up table that includes multiple predistortion functions, one of the multiple predistortion functions based on the adjusted error signal to provide a function for multiplication with the baseband input signal.

9. The method of claim 8, further comprising:
receiving, at an input of a delay unit, the baseband input signal; and
providing, at an output of the delay unit, the delayed version of the baseband input signal.

10. The method of claim 8, further comprising:
multiplying the selected one of the multiple predistortion functions with the baseband input signal.

11. The method of claim 8, further comprising:
receiving, at an input of a direct current distortion estimator, the input error signal;
providing, at an output of the direct current distortion estimator, an estimated distortion signal;
receiving, at a first input of a summer, the input error signal;
receiving, at a second input of a summer, the estimated distortion signal; and
providing, at an output of a summer, the adjusted error signal, wherein the adjusted error signal corresponds to a difference between the input error signal and the estimated distortion signal.

12. The method of claim 11, wherein the direct current distortion estimator is selected from a group consisting of a moving average block filter, a finite impulse response filter, and an infinite impulse response filter.

13. A transmitter, comprising:
a power amplifier; and
an adaptive predistortion unit, comprising:
an error signal unit having a first input configured to receive a delayed version of a baseband input signal, a second input configured to receive a power amplifier feedback signal from an output of the power amplifier, and an output configured to provide an input error signal that corresponds to a difference between the delayed version of the baseband input signal and the power amplifier feedback signal;
a signal conditioner having an input configured to receive the input error signal and an output configured to provide an adjusted error signal that has a lower direct current offset than the input error signal, wherein lowering the direct current offset associated with the input error signal reduces a transmitted signal distortion associated with the power amplifier; and
a look-up table including multiple predistortion functions, wherein one of the multiple predistortion functions is selected based on the adjusted error signal to provide a function for multiplication with the baseband input signal.

14. The transmitter of claim 13, wherein the adaptive predistortion unit further comprises:
a predistortion adjustment unit configured to multiply the selected one of the multiple predistortion functions times the baseband input signal.

15. The transmitter of claim 13, wherein the adaptive predistortion unit further comprises:
a delay unit including an input configured to receive the baseband input signal and an output configured to provide the delayed version of the baseband input signal.

16. The transmitter of claim 13, wherein the signal conditioner further comprises:
a direct current distortion estimator including an input configured to receive the input error signal and an output configured to provide an estimated distortion signal; and
a summer including a first input configured to receive the input error signal, a second input configured to receive the estimated distortion signal, and an output configured to provide the adjusted error signal, wherein the adjusted error signal corresponds to a difference between the input error signal and the estimated distortion signal.

17. The transmitter of claim 16, wherein the direct current distortion estimator is selected from a group consisting of a moving average block filter, a finite impulse response filter, and an infinite impulse response filter.

* * * * *